(12) United States Patent
Shimizu et al.

(10) Patent No.: US 11,373,877 B2
(45) Date of Patent: Jun. 28, 2022

(54) METHODS AND APPARATUS FOR IN-SITU PROTECTION LINERS FOR HIGH ASPECT RATIO REACTIVE ION ETCHING

(71) Applicant: APPLIED MATERIALS, INC., Santa Clara, CA (US)

(72) Inventors: Daisuke Shimizu, Milpitas, CA (US); Taiki Hatakeyama, Sunnyvale, CA (US); Shinichi Koseki, Mountain View, CA (US); Sean S. Kang, San Ramon, CA (US); Jairaj Joseph Payyapilly, San Bruno, CA (US); Hikaru Watanabe, Mie (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/846,869

(22) Filed: Apr. 13, 2020

(65) Prior Publication Data
US 2021/0320012 A1 Oct. 14, 2021

(51) Int. Cl.
*H01J 37/32* (2006.01)
*H01L 21/311* (2006.01)
(Continued)

(52) U.S. Cl.
CPC .. *H01L 21/31116* (2013.01); *H01J 37/32183* (2013.01); *H01J 37/32834* (2013.01);
(Continued)

(58) Field of Classification Search
CPC ........... H01L 21/31116; H01L 21/0337; H01L 21/02115; H01L 21/31144; H01L 21/0332;
(Continued)

(56) References Cited

U.S. PATENT DOCUMENTS 6,051,503 A 4/2000 Bhardwaj et al.
6,103,631 A 8/2000 Soda et al.
(Continued)

OTHER PUBLICATIONS

Banqiu Wu, Ajay Kumar, and Sharma Pamarthy, High Aspect Ratio Silicon Etch—a Review, Journal of Applied Physics 108, 051101 (2010) Applied Materials 974 E Arques Ave, M/S 81506, Sunnyvale, CA 94085, 20 pages.
(Continued)

*Primary Examiner* — Lan Vinh
(74) *Attorney, Agent, or Firm* — Moser Taboada (57) ABSTRACT

Methods and apparatus for producing high aspect ratio features in a substrate using reactive ion etching. In some embodiments, a method comprises flowing acetylene gas into a process chamber to produce a diamond like carbon deposition on a pattern mask or on at least one layer of oxide or nitride on the substrate, flowing a gas mixture of a first gas of a hydrofluorocarbon-based gas and a second gas of a fluorocarbon-based gas into the process chamber, forming a plasma from the gas mixture using an RF power source and at least one RF bias power source, performing an anisotropic etch of the at least one layer of oxide or nitride on the substrate using the pattern mask, and evacuating the process chamber while interrupting the RF power source to stop plasma formation.

20 Claims, 7 Drawing Sheets

(51) Int. Cl.
*H01L 21/02* (2006.01)
*H01L 21/033* (2006.01)

(52) U.S. Cl.
CPC .... *H01L 21/02115* (2013.01); *H01L 21/0332* (2013.01); *H01L 21/0337* (2013.01); *H01L 21/0338* (2013.01); *H01L 21/31144* (2013.01); *H01J 2237/3341* (2013.01)

(58) Field of Classification Search
CPC ............ H01L 21/0338; H01L 21/02274; H01J 37/32834; H01J 37/32183; H01J 2237/3341
USPC ....... 438/694, 706, 712, 714, 717, 723, 743, 438/758, 710, 711
See application file for complete search history.

(56) References Cited

U.S. PATENT DOCUMENTS

| | | | |
|---|---|---|---|
| 6,583,063 B1 | 6/2003 | Khan et al. | |
| 6,784,108 B1 | 8/2004 | Donohoe et al. | |
| 6,833,325 B2 | 12/2004 | Huang et al. | |
| 10,593,518 B1 | 3/2020 | Shimizu et al. | |
| 2003/0045114 A1 | 3/2003 | Ni et al. | |
| 2003/0211752 A1 | 11/2003 | Rattner et al. | |
| 2005/0037624 A1 | 2/2005 | Huang et al. | |
| 2007/0264841 A1 | 11/2007 | Chebi et al. | |
| 2009/0029067 A1* | 1/2009 | Sciamanna | C23C 16/26 427/577 |
| 2015/0099367 A1* | 4/2015 | Kim | H01J 37/32165 438/715 |
| 2016/0013067 A1 | 1/2016 | Wang et al. | |
| 2016/0276212 A1 | 9/2016 | Horikoshi et al. | |
| 2018/0204728 A1 | 7/2018 | Oomori et al. | |
| 2019/0288737 A1* | 9/2019 | Hanks | H03F 1/56 |
| 2019/0362983 A1* | 11/2019 | Shimizu | H01J 37/3244 |
| 2020/0066540 A1 | 2/2020 | Hudson et al. | |
| 2020/0126804 A1 | 4/2020 | Dole et al. | |
| 2020/0194272 A1 | 6/2020 | Jain et al. | |

OTHER PUBLICATIONS

International Search Report and Written Opinion for PCT/US2020/015155 dated May 20, 2020.

* cited by examiner

METHODS AND APPARATUS FOR IN-SITU PROTECTION LINERS FOR HIGH ASPECT RATIO REACTIVE ION ETCHING

FIELD

Embodiments of the present principles generally relate to semiconductor processing.

BACKGROUND

To increase density, manufacturers must continually shrink the sizes of individual features in order to fit more features in a given space. Three-dimensional features may also be used to further progress the density of a given area of a substrate during semiconductor manufacturing. Multiple circuit layers may also be constructed to allow more features for a given area of the substrate. The addition of three-dimensional features and multi-layered circuits may also require features with high aspect ratios that can be formed through many layers of the substrate to interconnect parts of the circuits. As the aspect ratios increase, the reliability of the features may be reduced if the production techniques, such as etching, cause imperfections in the features. A feature such as a hole or trench that is not properly formed may cause a decrease in density and reliability. Thus, the inventors have found that producing features with well-formed critical dimensions (CD) is crucial to meeting the ever-increasing circuit density demands.

Accordingly, the inventors have provided improved methods and apparatus for etching semiconductor structures on a substrate.

SUMMARY

Methods and apparatus for etching semiconductor structures are provided herein.

In some embodiments, a method for etching a substrate may comprise forming a first diamond like carbon (DLC) deposition on a pattern mask using acetylene gas ($C_2H_2$), flowing a gas mixture of a first gas of a hydrofluorocarbon-based gas and a second gas of a fluorocarbon-based gas into the process chamber, diluting the gas mixture by flowing an inert gas into the process chamber, flowing a third gas into the process chamber, the third gas is an organic film ashable chemistry-based gas, forming a plasma from the gas mixture using an RF power source and providing biasing with at least one RF bias power source, performing an anisotropic etch, via the plasma, of the at least one layer of oxide or nitride on the substrate using the pattern mask, and evacuating the process chamber while interrupting the RF power source to stop plasma formation.

In some embodiments, the method may further include forming a second diamond like carbon (DLC) deposition on a pattern mask or the at least one layer of oxide or nitride on the substrate and repeating the etching and DLC deposition to form at least one hole through a plurality of alternating oxide and nitride layers on the substrate to expose portions of the substrate, wherein the RF power source is connected to an upper electrode above the substrate and the at least one RF bias power source is connected to a lower electrode under the substrate, wherein the RF power source and the at least one RF bias power source are connected to at least one lower electrode under the substrate, performing a dynamic ramping of at least one process parameter based on a processing time or etch depth, wherein the first gas has a chemical composition of $C_3H_2F_4$ and the second gas has a chemical composition of $C_3F_6$, etching alternating layers of oxide and nitride on the substrate with the gas mixture of the first gas and the second gas having an oxide to nitride selectivity of approximately 1:1, pulsing the RF power source to form the plasm and pulsing the at least one RF bias power source to assist in ion attraction towards the substrate, linking the RF power source to the at least one RF bias power source and respective impedance matching networks to adjust RF power delivery to the process chamber, forming the plasma with the RF power source operating at a frequency of approximately 40 MHz to approximately 200 MHz and performing the anisotropic etch with the at least one RF bias power source operating at a frequency less than approximately 6 MHz, and/or wherein the RF power source has a peak power level less than the at least one RF bias power source.

In some embodiments, a method for etching a substrate may comprise flowing a gas mixture of a first gas of a hydrofluorocarbon-based gas and a second gas of a fluorocarbon-based gas into a process chamber, the gas mixture having an oxide to nitride etching selectivity of approximately 1:1, diluting the gas mixture by flowing an inert gas into the process chamber, flowing a third gas into the process chamber, the third gas is configured to prevent clogging during etching, forming a plasma from the gas mixture using an RF power source and providing with at least one RF bias power source, performing an anisotropic etch, via the plasma, of at least one layer of oxide or nitride on the substrate using a pattern mask, flowing acetylene gas ($C_2H_2$) into the process chamber to produce a diamond like carbon (DLC) deposition on the pattern mask or on the at least one layer of oxide or nitride on the substrate and evacuating the process chamber while interrupting the RF power source to stop plasma formation, wherein the DLC deposition occurs at an RF bias power of approximately 500 volts or higher, wherein the DLC deposition occurs at a pressure of approximately 0.2 pascal, ramping a flow rate of the inert gas upward based on processing time or etch depth, repeating the method to form at least one hole through a plurality of alternating oxide and nitride layers on the substrate to expose portions of the substrate, wherein the first gas has a chemical composition of $C_3H_2F_4$, the second gas has a chemical composition of $C_3F_6$, the inert gas is krypton, and the third gas is oxygen, ramping a flow rate of the gas mixture downward based on processing time or etch depth, and/or dynamically ramping one or more process parameters to provide active aspect ratio dependent etching control for selective reactive ion etching by depth.

In some embodiments, a non-transitory computer readable medium having instructions stored thereon that, when executed, may cause a method of operating a substrate processing system to be performed. The method may comprise flowing a gas mixture of a first gas of a hydrofluorocarbon-based gas and a second gas of a fluorocarbon-based gas into a process chamber, the gas mixture having an oxide to nitride etching selectivity of approximately 1:1, diluting the gas mixture by flowing an inert gas into the process chamber, flowing a third gas into the process chamber, the third gas is configured to prevent clogging during etching, forming a plasma from the gas mixture using an RF power source and providing biasing with at least one RF bias power source, performing an anisotropic etch, via the plasma, of at least one layer of oxide or nitride on a substrate using a pattern mask, flowing acetylene gas ($C_2H_2$) into the process chamber to produce a diamond like carbon (DLC) deposition on the pattern mask or on the at least one layer of oxide or nitride on the substrate, and evacuating the process chamber while interrupting the RF power source to stop plasma formation.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide increased critical dimension (CD) uniformity in reactive ion etching (RIE) of high aspect ratio features in substrates. Pattern mask integrity is also greatly improved while increasing bow protection of the features and eliminating hole distortion—increasing both reliability and feature density. The processes of the present principles can be used in a single reactive ion etch chamber that provides both etching and in-situ protection liners that provide high aspect ratio feature etching. Entrance clogging of the features (necking) during etching is significantly reduced, eliminating the need for trim processes, saving processing time and reducing costs. The need for using a separate chemical vapor deposition (CVD) chamber for depositing a conformal liner material is also advantageously eliminated.

The methods and apparatus of the present principles advantageously allow higher aspect ratios for contact applications and bridge applications by overcoming challenges in etching selectivity control and sidewall bow control and the like. Aspect ratios of greater than approximately 50:1 may be achieved. Because the methods and apparatus allow for control adjustments of the processes, the features formed in a multilayered stack of oxide and nitride materials on a substrate have smooth sidewalls and high aspect ratios, increasing both performance and reliability. Multiple linked (e.g., master/slave) RF power sources may be used to provide individual control of a plasma power source and at least one bias power source. The RF power sources may also use a control schema which allows pulsing of the power sources at various times during a cycle with almost instantaneous adjustments that can be based on processing timing and/or etching depth. The processes may also utilize a gas mixture of a first gas (e.g., a hydrofluorocarbon gas such as, for example, $C_3H_2F_4$ gas and the like) with a second gas (e.g., a fluorocarbon gas such as, for example, $C_3F_6$, and the like). The first gas and second gas may be adjusted to provide an approximately 1:1 etch selectivity of oxide materials to nitride materials. The chemistry of the gas mixture and other gases aid in precisely controlling the etching process to yield smooth sidewalls for high aspect ratio features even when the etched material alternates between oxide and nitride.

The methods may also utilize dynamic parameter ramping (DPR) to accurately and smoothly control increases and decreases (i.e., upward/downward ramping) in a parameter's value in response to timing and/or etching depth. DPR may be used to control, for example, process chamber pressure, RF plasma power, RF bias power, process gas flow rates, electrostatic chuck (ESC) temperature, and/or inert gas flow rates, etc. DPR allows adjustments to be made to avoid pattern mask clogging, especially in the top area (necking), by adjusting parameters during the etch process. In addition, DPR may control cleaning gases such as $O_2$ or $N_2$ and the like to avoid over etching the pattern mask and sidewall bow during the initial stages of an etching process (e.g., ramping $O_2$ gas upward as etching depth increases to provide active control based on etch depth without overly depleting the pattern mask in the initial etching stages). The precision control of the processes avoids closure of the top of a feature (necking) during etching and promotes smoother and faster etch processes. By avoiding necking, the etching process can continue uninterrupted and ion deflection that attacks the sidewalls of the feature (i.e., bow) is avoided. During conventional RIE processes, trimming is required to remove the necking before a protective liner for the sidewalls is deposited in a separate CVD chamber. The methods and apparatus of the present principles eliminates the trim process altogether and uses only a single process chamber, saving both significant costs and processing time.

In some embodiments, the methods of the present principles include an etching mode, a deposition mode, and an evacuation mode. In some embodiments, the overall time-multiplexed etching process may be performed by impedance tuning for multiple RF pulse frequencies that alternate repeatedly among the three modes to achieve high aspect ratio structures with near vertical profiles (feature sidewalls of approximately 80 degrees to approximately 90 degrees perpendicular to a surface being etched). The RF power source pulsing control can make process adjustments on the order of microseconds. The process adjustment speed and the special gas mixtures with an approximately 1:1 oxide to nitride selectivity along with the DPR control allow management of necking and sidewall bow (e.g., ion deflection into feature sidewalls). An in-situ protection liner is applied to a substrate prior to or after etching to aid in bow control and to provide a protective cap on top edges of the pattern mask to keep ions from deflecting into a feature's sidewalls. The in-situ protection liner can also provide sidewall protection by conformally coating inner walls of a pattern mask or etch feature. After the deposition mode, gases and byproducts are pumped out of the process chamber as part of the evacuation mode. Because the entrance to the pattern mask is kept clear, the in-situ protection liner can be delivered deeper into the feature and ion and etching reaction gases can go deeper into the feature, allowing for very smooth etching.

Figure 1A:
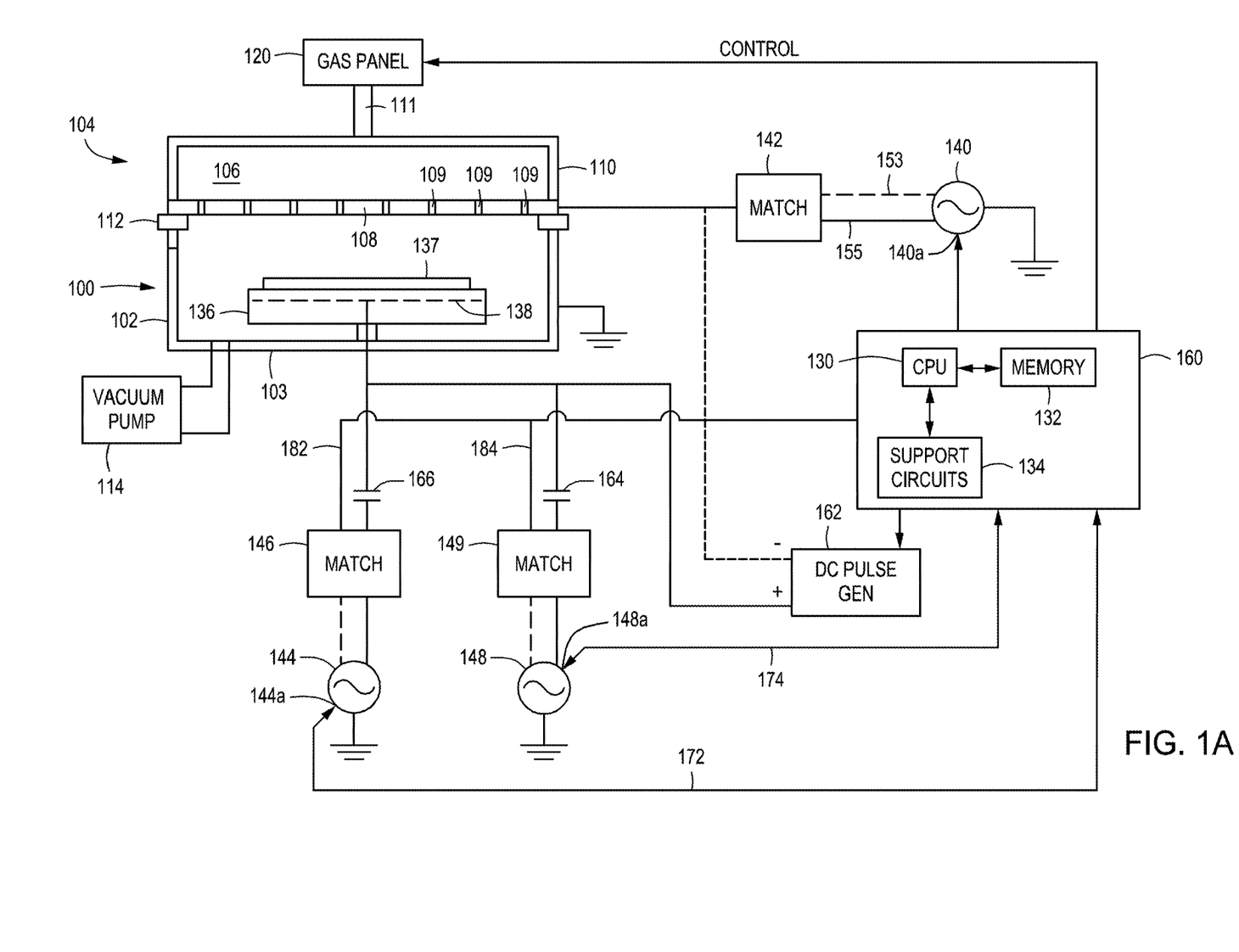
FIG. 1A depicts a plasma reactor in accordance with some embodiments of the present principles.

FIG. 1A depicts a plasma reactor which may be utilized to perform the methods disclosed herein. The methods may be performed in a capacitively coupled plasma reactor (e.g., as illustrated in FIG. 1A) or any other suitable plasma reactor, such as an inductive coupled plasma reactor. The plasma reactor of FIG. 1A includes a process chamber 100 enclosed by a cylindrical side wall 102, a floor 103, and a lid 104. In some embodiments, the lid 104 may be a gas distribution showerhead including a gas manifold 106 overlying a gas distribution plate 108 having orifices 109 formed through the gas distribution plate 108. The gas manifold 106 is enclosed by a manifold enclosure 110 having a gas supply inlet 111. The gas distribution showerhead (i.e., lid 104) is electrically insulated from the cylindrical side wall 102 by an insulating ring 112. A vacuum pump 114, such a turbomolecular pump, is capable of evacuating the process chamber 100 of gases and by-products and maintains the pressure inside of the process chamber 100. A gas panel 120 controls the individual flow rates of different process gases to the gas supply inlet 111. A support pedestal 136 supported through the floor 103 of the process chamber 100 may have an insulating top surface and an internal electrode 138. The internal electrode 138 may, for example, be used for supplying bias power during processing.

Power may be applied to the processing chamber 100 from a plurality of RF generators 140, 144, 148. The plurality of RF generators 140, 144, 148, includes a master RF generator 140 and one or more slave RF generators 144, 148. Plasma source power is applied to the lid 104 (also referred to herein as a gas distribution showerhead) from the master RF generator 140 through an impedance matching network 142. The lid 104 or gas distribution showerhead is formed of a conductive material, such as aluminum for example, and therefore serves as a lid electrode. In some embodiments, the master RF generator 140 may generate VHF power in the high portion of the VHF spectrum, such as in a range of approximately 40 MHz to approximately 200 MHz. In some embodiments, the master RF generator 140 has the capability of pulsing the power generated at a desired pulse rate and duty cycle. For example, the master RF generator 140 has a pulse control input 140a for receiving a control signal or signals defining the pulse rate and/or duty cycle as well as the phase of each pulse produced by the master RF generator 140. In some embodiments, the master RF generator 140 may be connected to the impedance matching network 142 via high speed link cable 153 and RF cable 155. The master RF generator 140 may be connected to the first slave RF generator 144 via high speed link cable 172. The master RF generator 140 may be connected to the second slave RF generator 148 via high speed link cable 174. The master RF generator 140 may be connected to the impedance matching networks 142, 146, and 149, via high speed link cables 153, 182, and 184, respectively.

In some embodiments as shown in FIG. 1A, bias power is applied to the internal electrode 138 from a first slave RF generator 144 through an impedance matching network 146 and a second slave RF generator 148 through an impedance matching network 149. In some embodiments, the first slave RF generator 144 and the second slave RF generator 148 may apply bias power while the master RF generator 140 applies plasma source power. The one or more slave RF generators 144, 148 may generate high frequency (HF) or low frequency (LF) power in the LF spectrum to a low portion of the HF spectrum, such as in a range of approximately 30 kHz to approximately 6 MHz. For example, the first slave RF generator 144 and the second slave RF generator 148 may generate power at approximately 2 MHz and approximately 400 kHz, respectively. The one or more slave RF generators 144, 148 have the capability of pulsing the power generated at a desired pulse rate and duty cycle. For example, the one or more slave RF generators 144, 148 have pulse control inputs 144a, 148a for receiving a control signal or signals defining the pulse rate and/or duty cycle as well as the phase of each pulse produced by the one or more slave RF generators 144, 148. The one or more slave RF generators 144, 148 may be independently pulsed, phased, and/or duty cycle controlled. Further, the one or more slave RF generators 144, 148 may be pulsed synchronously or asynchronously.

In some embodiments, the impedance matching networks 142, 146, 149 may be formed by one or more capacitors and/or an inductor. The values of capacitor may be electronically or mechanically tuned to adjust the matching of each of the impedance matching networks 142, 146, 149. In lower power systems, the one or more capacitors may be electronically tuned rather than mechanically tuned. In some embodiments, the impedance matching networks 142, 146, 149 may have a tunable inductor. In some embodiments, one or more of the capacitors used in the impedance matching networks 142, 146, 149 may be one or more fixed capacitors or series capacitors. In other embodiments, one or more of the capacitors used in the impedance matching networks 142, 146, 149 may be a variable capacitor, which may be electronically or mechanically tuned to adjust the matching of the impedance matching networks 142, 146, 149. In some embodiments, one or more of the impedance matching networks 142, 146, 149 may have a capacitive shunt to ground.

In some embodiments, a controller 160 is programmable to apply pulse control signals to each of the pulse control inputs 140a, 144a, 148a of the plurality of RF generators 140, 144, 148 to produce the desired phase lead or lag relationship and/or duty cycle relationship among the pulses of the master RF generator 140 and the slave RF generators 144, 148. The controller 160 may also control other aspects of the tool/process chamber. Although shown as a separate component in FIG. 1A, in some embodiments, the controller 160 can be disposed internally inside of each RF generator. Synchronization signals would be generated at a master RF generator (e.g., master RF generator 140), and sent to other slave generators (e.g., slave RF generators 144, 148). The controller 160 may also load and execute gas recipes to be used in pre-processing, etching of features, and post processing. The controller 160 may be used to control process sequences and regulate gas flows from the gas panel 120.

In some embodiments, the RF generators 140, 144, 148, the impedance matching networks 142, 146, 149, and/or the controller 160 comprise a central processing unit (CPU) 130, a plurality of support circuits 134, and a memory 132. While the present exemplary embodiments of the plurality of RF generators 140, 144, 148, the impedance matching networks 142, 146, 149, and controller 160 are discussed with respect to a computer having a CPU, support circuits, and a memory, one of ordinary skill in the art would recognize that the plurality of RF generators 140, 144, 148, the impedance matching networks 142, 146, 149, and controller 160 could be implemented in a variety of ways, including as an application specific interface circuit (ASIC), a field-programmable gate array (FPGA), a system-on-a-chip (SOC), and the like. Various embodiments of the controller 160 may also be integrated within other process tool controllers, with corresponding input/output interfaces as known in the art.

The support circuits 134 may include a display device as well as other circuits to support the functionality of the CPU 130. Such circuits may include clock circuits, cache, power supplies, network cards, video circuits and the like. The memory 132 may comprise read only memory, random access memory, removable memory, disk drives, optical drives and/or other forms of digital storage. The memory 132 is configured to store an operating system, and a sub-fab control module. The operating system executes to control the general operation of the plurality of RF generators 140, 144, 148, the impedance matching networks 142, 146, 149, and controller 160, including facilitating the execution of various processes, applications, and modules to control the one or more RF generators 140, 144, 148 or the impedance matching networks 142, 146, 149 in order to perform the methods discussed herein.

In some embodiments, a DC generator 162 may be coupled to either (or both) the internal electrode 138 and the lid 104. In some embodiments, DC generator 162 may supply continuous and/or variable DC. In some embodiments, DC generator 162 may provide pulsed DC power. The pulse repetition rate, phase and duty cycle of the DC generator are controlled by the controller 160. A DC isolation capacitor 164, 166 may be provided to isolate each slave RF generator 148, 144, respectively, from the DC generator 162. A DC signal generated by the DC generator may be synchronized with the RF signals generated by the RF generators 140, 144, 148 to provide benefits such as reduced charge-up on a substrate 137 or improved etch rate control of the substrate using a plasma formed in the plasma reactor.

Figure 1B:
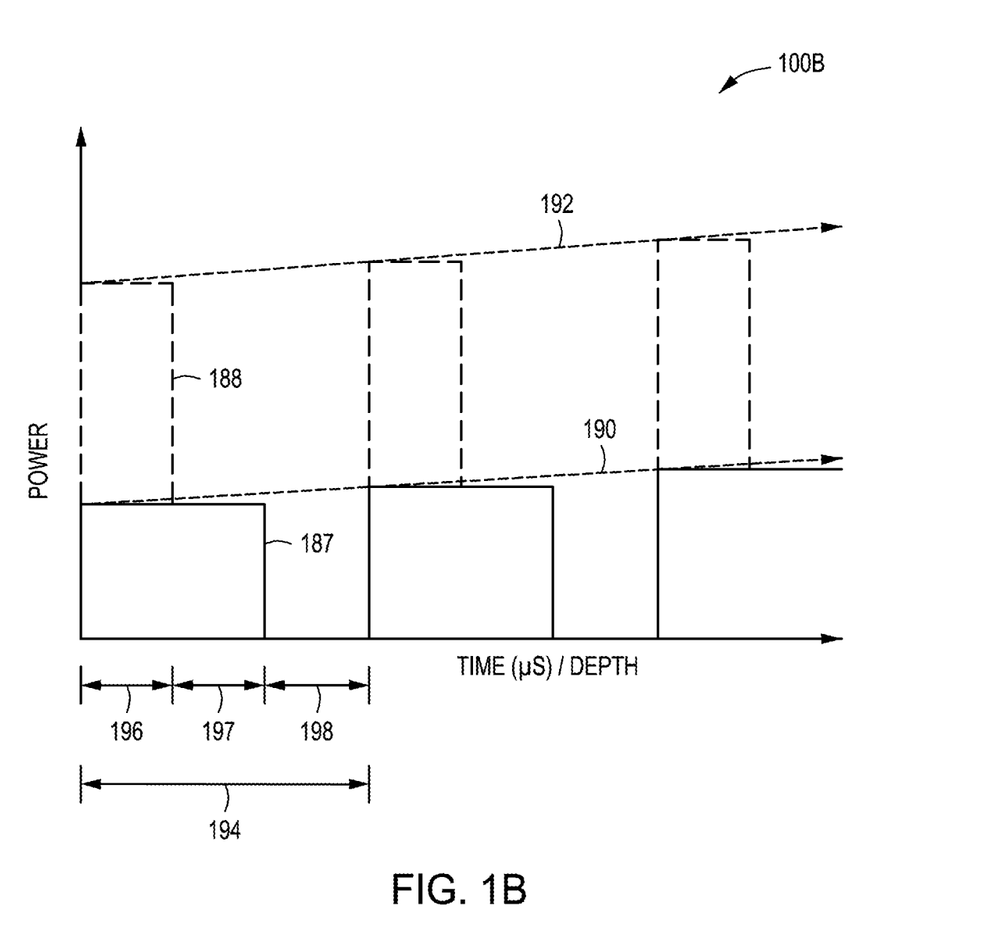
FIG. 1B depicts a graph of RF pulse timing for the plasma reactor of FIG. 1A in accordance with some embodiments of the present principles.

In some embodiments, the RF generators 140, 144, 148 may be adjusted on the order of microseconds. The fast control of the RF generators 140, 144, 148 allows for precise control of the methods of the present principles. In some embodiments, as shown in FIG. 1B, the RF generators 140, 144, 148 may be controlled according to the graph 100B. The interlinking with transistor-transistor-logic (TTL) signals of the RF generators 140, 144, 148 in the master/slave relationship and the respective impedance matching networks 142, 146, 149 allows for microsecond timing of pulses generated by the respective RF generator. The RF master or slave generators provide the TTL signals for synchronization to RF matches. Target impedance is calculated by averaging from multiple impedances detected in each interval or period allowing for fast RF power changes without RF power losses due to impedance mismatches.

The master RF generator 140 may produce a plasma pulse 187 with a first duration of a first cycle 194. During the first cycle 194, the slave RF generators 144, 148 generate a bias pulse 188 for a second duration shorter than the first duration. In some embodiments, an etching period 196 may occur during the overlap period of the plasma pulse 187 and the bias pulse 188. In some embodiments, in the part of the first duration of the plasma pulse 187 without the bias pulse 188, a deposition period 197 may occur within the process chamber 100. In some embodiments, a chamber cleansing period 198 (e.g., chamber gas and by-product evacuation) may occur in the period of the first cycle 194 without the plasma pulse 187 and the bias pulse 188.

In some embodiments, the power level of the plasma pulse 187 may be increased (arrow 190) or decreased for each pulse over a given amount of time or for a given amount of etching depth in a process. In some embodiments, the power level of the bias pulse 188 may be increased (arrow 192) or decreased for each pulse over a given amount of time or for a given amount of etching depth in a process. In some embodiments, each of the slave RF generators 144, 148 supplying bias power may be pulsed independently at different levels, in phase or out of phase. In some embodiments, bias power may be adjusted by adjusting the bias voltage levels.

Figure 2A:
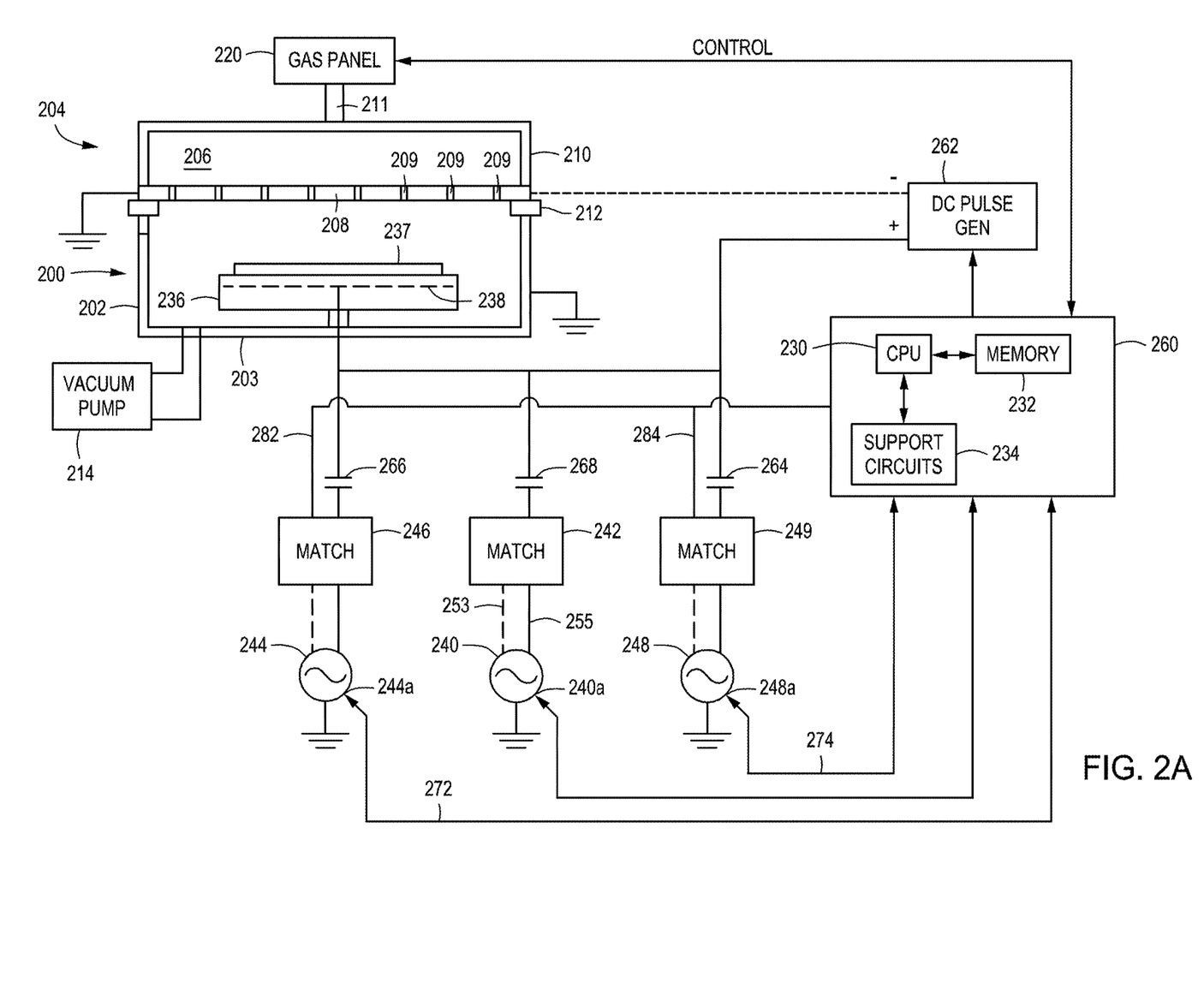
FIG. 2A depicts a plasma reactor in accordance with some embodiments of the present principles.

FIG. 2A depicts another configuration of a plasma reactor which may be utilized to perform the methods disclosed herein. The methods may be performed in a capacitively coupled plasma reactor (e.g., as illustrated in FIG. 2A) or any other suitable plasma reactor, such as an inductive coupled plasma reactor. The plasma reactor of FIG. 2A includes a process chamber 200 enclosed by a cylindrical side wall 202, a floor 203, and a lid 204. In some embodiments, the lid 204 may be a gas distribution showerhead including a gas manifold 206 overlying a gas distribution plate 208 having orifices 209 formed through the gas distribution plate 208. The gas manifold 206 is enclosed by a manifold enclosure 210 having a gas supply inlet 211. In some embodiments, the gas distribution showerhead (i.e., lid 204) is RF grounded and may be electrically insulated from the cylindrical side wall 202 by an optional insulating ring 212. In some embodiments, the gas distribution showerhead (i.e., lid 204) is RF grounded by making electrical contact with the cylindrical side wall 202 which is grounded. A vacuum pump 214, such a turbomolecular pump, is capable of evacuating the process chamber 200 of gases and by-products and maintains the pressure inside of the process chamber 200. A gas panel 220 controls the individual flow rates of different process gases to the gas supply inlet 211. A support pedestal 236 supported through the floor 203 of the process chamber 200 may have an insulating top surface and an internal electrode 238. The internal electrode 238 may, for example, be used for supplying bias power during processing.

Power may be applied to the processing chamber 200 from a plurality of RF generators 240, 244, 248. The plurality of RF generators 240, 244, 248, includes a master RF generator 240 and one or more slave RF generators 244, 248. Plasma source power is applied to the internal electrode 238 from the master RF generator 240 through an impedance matching network 242 and an optional DC blocking capacitor 268. The lid 204 or gas distribution showerhead is formed of a conductive material, such as aluminum for example, and therefore serves as a grounded lid electrode. In some embodiments, the master RF generator 240 may generate VHF power in the high portion of the VHF spectrum, such as in a range of approximately 40 MHz to approximately 200 MHz. In some embodiments, the master RF generator 240 has the capability of pulsing the power generated at a desired pulse rate and duty cycle. For example, the master RF generator 240 has a pulse control input 240*a* for receiving a control signal or signals defining the pulse rate and/or duty cycle as well as the phase of each pulse produced by the master RF generator 240. In some embodiments, the master RF generator 240 may be connected to the impedance matching network 242 via high speed link cable 253 and RF cable 255. The master RF generator 240 may be connected to the first slave RF generator 244 via high speed link cable 272. The master RF generator 240 may be connected to the second slave RF generator 248 via high speed link cable 274. The master RF generator 240 may be connected to the impedance matching networks 242, 246, and 249, via high speed link cables 253, 282, and 284, respectively.

In some embodiments as shown in FIG. 2A, bias power is applied to the internal electrode 238 from a first slave RF generator 244 through an impedance matching network 246 and a second slave RF generator 248 through an impedance matching network 249. In some embodiments, the first slave RF generator 244 and the second slave RF generator 248 may apply bias power while the master RF generator 240 applies plasma source power. The one or more slave RF generators 244, 248 may generate high frequency (HF) or low frequency (LF) power in the LF spectrum to a low portion of the HF spectrum, such as in a range of approximately 30 kHz to approximately 6 MHz. For example, the first slave RF generator 244 and the second slave RF generator 248 may generate power at approximately 2 MHz and approximately 400 kHz, respectively. The one or more slave RF generators 244, 248 have the capability of pulsing the power generated at a desired pulse rate and duty cycle. For example, the one or more slave RF generators 244, 248 have pulse control inputs 244a, 248a for receiving a control signal or signals defining the pulse rate and/or duty cycle as well as the phase of each pulse produced by the one or more slave RF generators 244, 248. The one or more slave RF generators 244, 248 may be independently pulsed, phased, and/or duty cycle controlled. Further, the one or more slave RF generators 244, 248 may be pulsed synchronously or asynchronously.

In some embodiments, the impedance matching networks 242, 246, 249 may be formed by one or more capacitors and/or an inductor. The values of capacitor may be electronically or mechanically tuned to adjust the matching of each of the impedance matching networks 242, 246, 249. In lower power systems, the one or more capacitors may be electronically tuned rather than mechanically tuned. In some embodiments, the impedance matching networks 242, 246, 249 may have a tunable inductor. In some embodiments, one or more of the capacitors used in the impedance matching networks 242, 246, 249 may be one or more fixed capacitors or series capacitors. In other embodiments, one or more of the capacitors used in the impedance matching networks 242, 246, 249 may be a variable capacitor, which may be electronically or mechanically tuned to adjust the matching of the impedance matching networks 242, 246, 249. In some embodiments, one or more of the impedance matching networks 242, 246, 249 may have a capacitive shunt to ground.

In some embodiments, a controller 260 is programmable to apply pulse control signals to each of the pulse control inputs 240a, 244a, 248a of the plurality of RF generators 240, 244, 248 to produce the desired phase lead or lag relationship and/or duty cycle relationship among the pulses of the master RF generator 240 and the slave RF generators 244, 248. The controller 260 may also control other aspects of the tool/process chamber. Although shown as a separate component in FIG. 2A, in some embodiments, the controller 260 can be disposed internally inside of each RF generator. Synchronization signals would be generated at a master RF generator (e.g., master RF generator 240), and sent to other slave generators (e.g., slave RF generators 244, 248). The controller 260 may also load and execute gas recipes to be used in pre-processing, etching of features, and post processing. The controller 260 may be used to control process sequences and regulate gas flows from the gas panel 220.

In some embodiments, the RF generators 240, 244, 248, the impedance matching networks 242, 246, 249, and/or the controller 260 comprise a central processing unit (CPU) 230, a plurality of support circuits 234, and a memory 232. While the present exemplary embodiments of the plurality of RF generators 240, 244, 248, the impedance matching networks 242, 246, 249, and controller 260 are discussed with respect to a computer having a CPU, support circuits, and a memory, one of ordinary skill in the art would recognize that the plurality of RF generators 240, 244, 248, the impedance matching networks 242, 246, 249, and controller 260 could be implemented in a variety of ways, including as an application specific interface circuit (ASIC), a field-programmable gate array (FPGA), a system-on-a-chip (SOC), and the like. Various embodiments of the controller 260 may also be integrated within other process tool controllers, with corresponding input/output interfaces as known in the art.

The support circuits 234 may include a display device as well as other circuits to support the functionality of the CPU 230. Such circuits may include clock circuits, cache, power supplies, network cards, video circuits and the like. The memory 232 may comprise read only memory, random access memory, removable memory, disk drives, optical drives and/or other forms of digital storage. The memory 232 is configured to store an operating system, and a sub-fab control module. The operating system executes to control the general operation of the plurality of RF generators 240, 244, 248, the impedance matching networks 242, 246, 249, and controller 260, including facilitating the execution of various processes, applications, and modules to control the one or more RF generators 240, 244, 248 or the impedance matching networks 242, 246, 249 in order to perform the methods discussed herein.

In some embodiments, a DC generator 262 may be coupled to either (or both) the internal electrode 238 and the lid 204. In some embodiments, DC generator 262 may supply continuous and/or variable DC. In some embodiments, DC generator 262 may provide pulsed DC power. The pulse repetition rate, phase and duty cycle of the DC generator are controlled by the controller 260. A DC blocking capacitor 264, 266, 268 may be provided to isolate the master RF generator 240 and/or each slave RF generator 248, 244, respectively, from the DC generator 262. A DC signal generated by the DC generator may be synchronized with the RF signals generated by the RF generators 240, 244, 248 to provide benefits such as reduced charge-up on a substrate 237 or improved etch rate control of the substrate using a plasma formed in the plasma reactor.

Figure 2B:
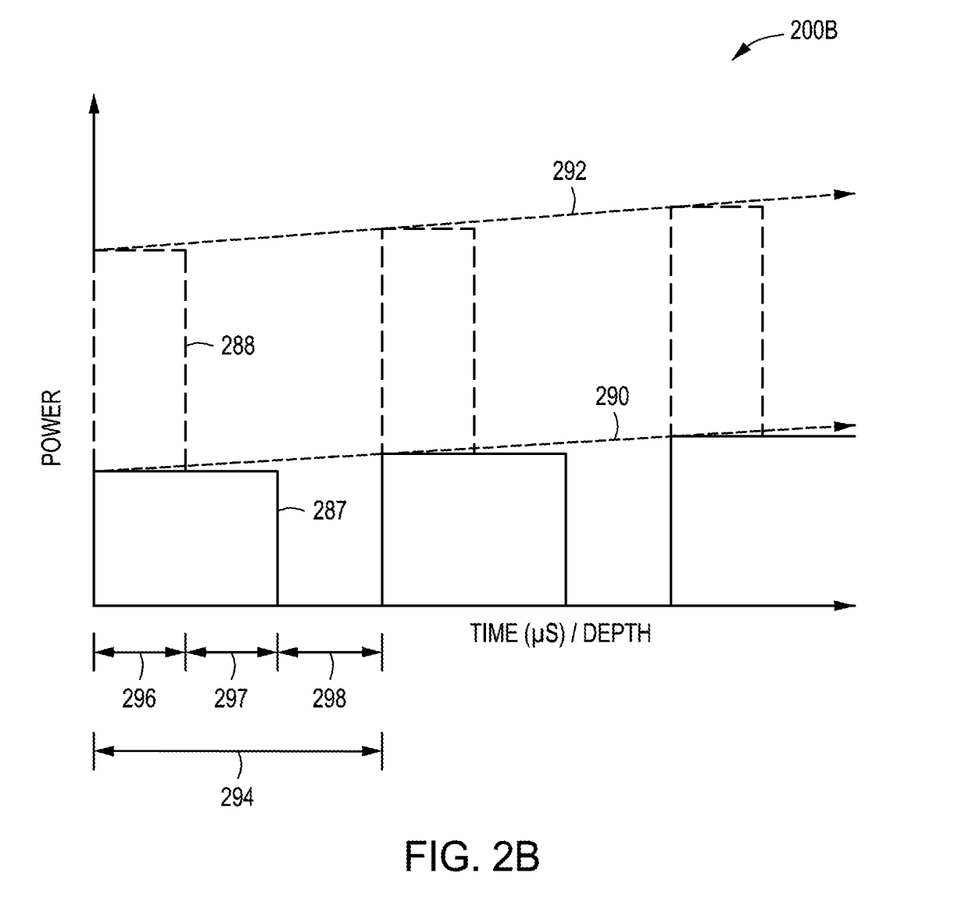
FIG. 2B depicts a graph of RF pulse timing for the plasma reactor of FIG. 2A in accordance with some embodiments of the present principles.

In some embodiments, the RF generators 240, 244, 248 may be adjusted on the order of microseconds. The fast control of the RF generators 240, 244, 248 allows for precise control of the methods of the present principles. In some embodiments, as shown in FIG. 2B, the RF generators 240, 244, 248 may be controlled according to the graph 200B. The interlinking with transistor-transistor-logic (TTL) signals of the RF generators 240, 244, 248 in the master/slave relationship and the respective impedance matching networks 242, 246, 249 allows for microsecond timing of pulses generated by the respective RF generator. The RF master or slave generators provide the TTL signals for synchronization to RF matches. Target impedance is calculated by averaging from multiple impedances detected in each interval or period allowing for fast RF power changes without RF power losses due to impedance mismatches.

The master RF generator 240 may produce a plasma pulse 287 with a first duration of a first cycle 294. During the first cycle 294, the slave RF generators 244, 248 generate a bias pulse 288 for a second duration shorter than the first duration. In some embodiments, an etching period 296 may occur during the overlap period of the plasma pulse 287 and the bias pulse 288. In some embodiments, in the part of the first duration of the plasma pulse 287 without the bias pulse 288, a deposition period 297 may occur within the process chamber 200. In some embodiments, a chamber cleansing period 298 (e.g., chamber gas and by-product evacuation) may occur in the period of the first cycle 294 without the plasma pulse 287 and the bias pulse 288.

In some embodiments, the power level of the plasma pulse 287 may be increased (arrow 290) or decreased for each pulse over a given amount of time or for a given amount of etching depth in a process. In some embodiments, the power level of the bias pulse 288 may be increased (arrow 292) or decreased for each pulse over a given amount of time or for a given amount of etching depth in a process. In some embodiments, each of the slave RF generators 244, 248 supplying bias power may be pulsed independently at different levels, in phase or out of phase. In some embodiments, bias power may be adjusted by adjusting the bias voltage levels.

Figure 3:
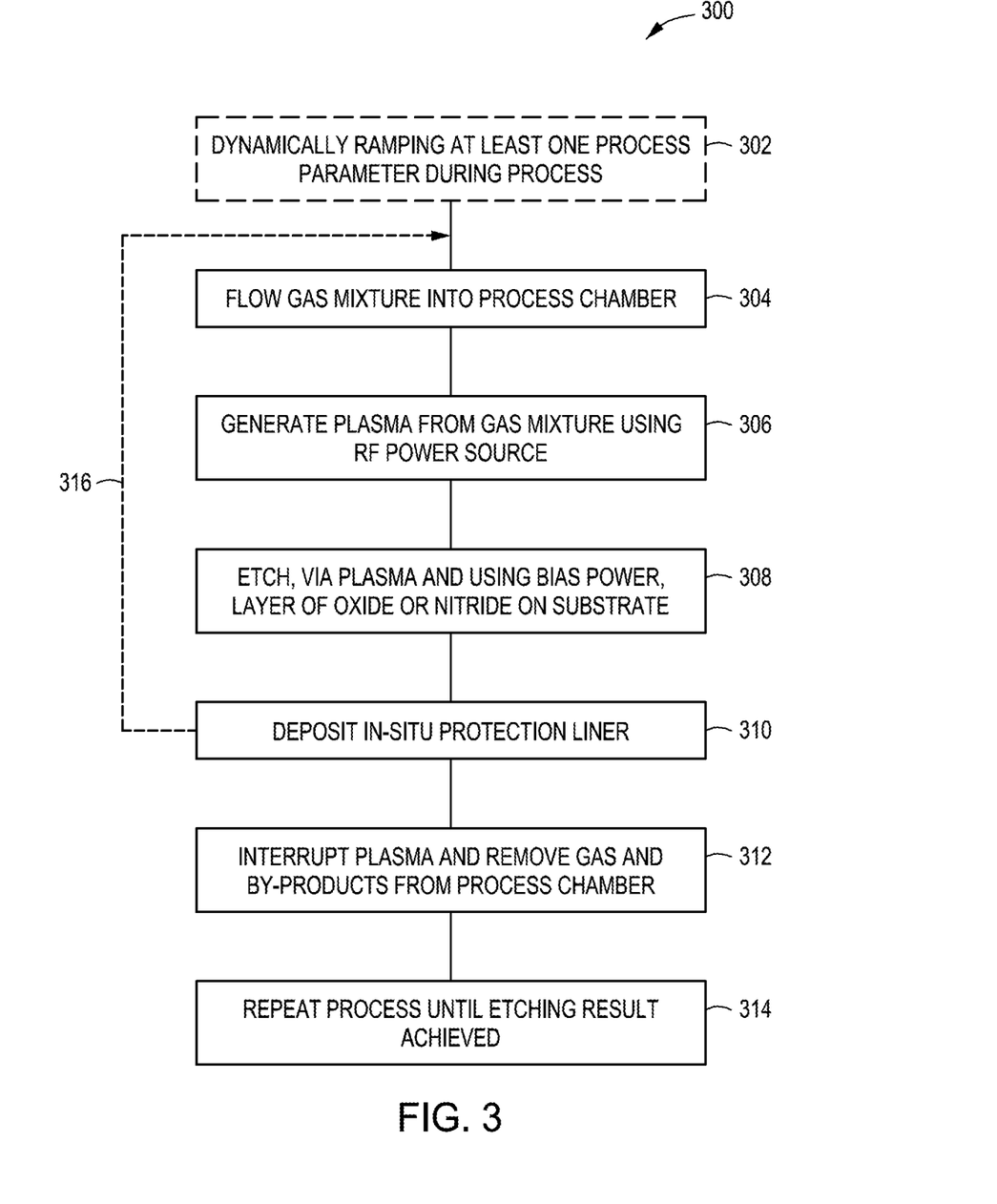
FIG. 3 is a method of etching oxide or nitride layers on a substrate in accordance with some embodiments of the present principles.

In FIG. 3, a method 300 of etching oxide and/or nitride layers on a substrate in accordance with some embodiments is illustrated. In some embodiments, the substrate temperature may be approximately 50 degrees Celsius to approximately 100 degrees Celsius during the processes. In optional block 302, in some embodiments of the method 300, a process parameter may be dynamically ramped during the etching process. The process parameter may be ramped upward and/or be ramped downward during a given process. The dynamic parameter ramping (DPR) of the process parameter may occur over a given time period (e.g., the time to complete the process, a given amount of time such as 500 seconds, etc.) or may occur based on an etching depth. The ramping may be indicated by a delta change over time or depth such as a plus or minus percentage of change from a starting value. DPR can activate a ramping slope (upward or downward) for active aspect ratio dependent etching (ARDE) control yielding selective RIE by depth.

By dynamically ramping process parameters, a higher quality etching process may be obtained for high aspect ratio features on a substrate. In some embodiments, as described above, the dynamic ramping may be adjusted on a pulse-by-pulse basis on the order of microseconds and/or may also be made on a continuous basis over time. In some embodiments, process power requirements such as plasma source power and/or biasing power may be ramped upward and/or downward as the etching depth increases. Increasing the bias power permits better anisotropic etching at the bottom of holes, for example, as the hole depth increases. In some embodiments, process gas flow rates and/or inert gas flow rates may also be dynamically ramped upward and/or downward. In some embodiments, the inert gas flow rates remain constant.

Figure 4:
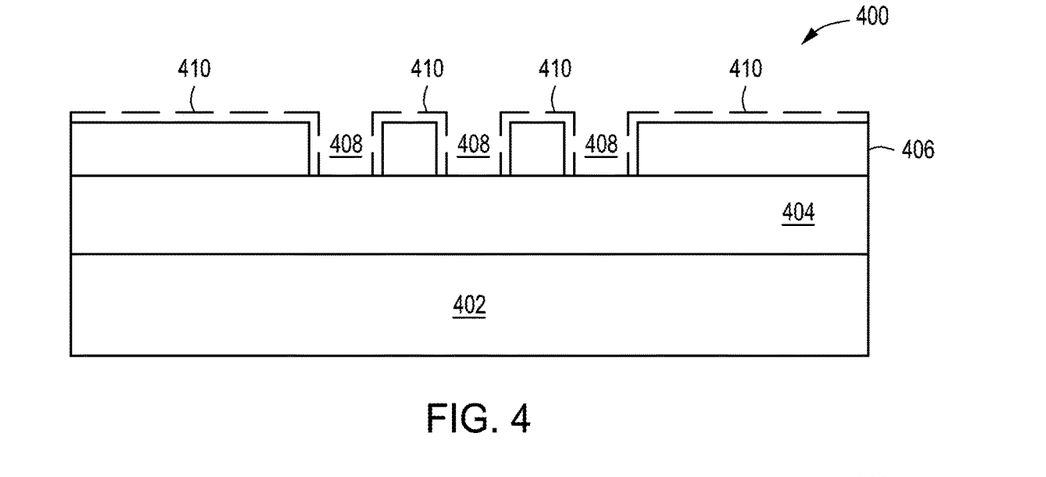
FIG. 4 is a cross-sectional view of a substrate with a layer of oxide and/or nitride and a pattern mask in accordance with some embodiments of the present principles.

The method 300 allows a single chamber to perform etching and deposition processes. The etching creates features such as holes and/or trenches in oxide and/or nitride layers on a substrate. The deposition provides an in-situ protection liner on the substrate to protect a pattern mask and/or sidewalls of features on the substrate. FIG. 4 depicts a cross-sectional view 400 of a substrate 402, such as substrate 137, 237 of FIGS. 1A, 2A with an oxide or nitride layer 404 (nitride layer 404 may also be composed of multiple alternating layers of oxide and nitride materials). A pattern mask 406 has been formed on the oxide or nitride layer 404 with openings 408. The pattern mask 406 may be a photoresist mask or a hard mask. In some embodiments, deposition of an in-situ protection liner 410 (see FIG. 4) may be used to protect the pattern mask 406 before etching of the oxide or nitride layer 404 (see dotted line 316 from block 310 of FIG. 3). In some embodiments, a subsequent in-situ protection liner 616 (see FIG. 6) may be formed after etching of the oxide or nitride layer 404 as discussed for block 310.

In block 304, a gas mixture of a first gas and a second gas is flowed into the process chamber 100, 200. The first gas is a hydrofluorocarbon-based gas, $C_xH_yF_z$— where each x, y, and z are at least 1, such as, for example, $C_3H_2F_4$, $CH_2F_2$, $CHF_3$, $C_4H_9F$, $CH_3F$, etc. The first gas may be used as a nitride layer etching gas. In some cases, the first gas also may be used as an oxide layer deposition gas. The second gas is a fluorocarbon-based gas, $C_xF_y$— where each x, and y are at least 1, such as, for example, $C_3F_6$, $C_3F_8$, $C_4F_6$, $C_4F_8$, $CF_4$, etc. The second gas may be used as an oxide layer etching gas. In some cases, the second gas may also be used as a nitride layer deposition gas. In some embodiments, the first gas and second gas may have a ratio of 1:1 to provide a selectivity ratio of oxide etching to nitride etching of 1:1. A third gas may also be flowed into the process chamber. The third gas is an inert gas such as nitrogen, krypton, helium, neon, argon, xenon, radon, etc. The third gas allows dilution of the gas mixture to allow for better mask etching control. A fourth gas may also be flowed into the process chamber. The fourth gas is a cleaning gas with any combination of organic film ashable chemistry such as nitrogen gas or oxygen gas, etc. The fourth gas aids in preventing clogging of high aspect ratio features during the etching process and may increase as etching depth increases.

The gas mixture provides a selective high aspect ratio process that provides a higher pattern mask selectivity for etching single layer and/or oxide-nitride multi-stacks. In some embodiments, the gases may be flowed into the process chamber separately or together at flow rates greater than 0 sccm to approximately 1000 sccm. In some embodiments, the process chamber has a pressure of approximately 5 mTorr to approximately 50 mTorr. In some embodiments, the gas mixture provides the basis for ions and radicals that provide an etching selectivity ratio of oxide to nitride of approximately 1:1. In some embodiments, the gas mixture and/or flow rates may be controlled such that an etch selectivity of oxide/nitride compared to the pattern mask may be approximately 5:1 to approximately 7:1.

In some embodiments, the gas mixture has a flow rate of approximately 100 sccm to approximately 200 sccm. In some embodiments, the third gas such as, for example, helium, neon, radon, argon, krypton, xenon, and/or nitrogen is also flowed into the chamber with a flow rate of approximately 100 sccm to approximately 200 sccm. In some embodiments, the fourth gas, such as $O_2$, may be introduced into the process chamber at a rate of 100 sccm and may be subject to DPR control. In some semiconductors, a layer of oxide is alternated with a layer of nitride. With an approximately 1:1 selectivity ratio, the oxide and nitride can be etched at the same rate with the gas mixture. In some embodiments, the flow rate of the gas mixture or individual gases may be dynamically ramped downward over time or as the etching depth increases.

In block 306, plasma is generated from the gas mixture. The gas mixture is ionized and produces ions and radicals that can etch oxide or nitride materials. In some embodiments, the gas mixture is ionized in the presence of the third gas, such as, for example, $O_2$ to produce plasma with a plurality of ions, radicals, and various molecules.

In some embodiments, the gases may be present in the process chamber at a volume percentage ratio of the gas mixture (hydrofluorocarbon-based gas and fluorocarbon-based gas) to the third gas from approximately 80:20 to approximately 30:70. In some embodiments, the gases may be present in the process chamber at a volume percentage ratio of the gas mixture to the third gas from approximately 15:85 to approximately 25:75. In some embodiments, the volume percentage ratio of the third gas to the first gas in the process chamber is from approximately 0:100 to approximately 90:10 or from approximately 15:85 to approximately 25:75. In some embodiments using $O_2$ as the third gas, the first gas comprises a volume percentage of the etchant from approximately 15 volume percent to approximately 45 volume percent, the companion gas comprises a volume percent of the etchant from approximately 15 volume percent to 50 volume percent, and the $O_2$ comprises a volume percent of the etchant from approximately 10 volume percent to approximately 40 volume percent. The ratio of ionizable gas mixture to $O_2$ is from approximately 90:10 to approximately 60:40.

In some embodiments, the plasma is generated by an RF plasma power source such as the master RF generator 140, 240 in conjunction with at least one RF bias source such as the slave RF generators 144, 148, 244, 248 as illustrated in FIGS. 1A and 2A. In some embodiments, the master RF generator 140, 240 provides a transistor-transistor-logic (TTL) signal that can be used to synchronize the pulses between the master RF generator 140, 240 and the slave RF generators 144, 148, 244, 248. In some embodiments, the RF plasma power source may operate at a very high frequency (VHF) of approximately 40 MHz to approximately 200 MHz. In some embodiments, the RF plasma power source may operate at a frequency of approximately 40 MHz, approximately 121 MHz, and/or approximately 162 MHz and the like. In some embodiments, the RF plasma power source may be ramped to a peak power of approximately 0.5 kW to a peak power of approximately 4 kW at a ramping rate of approximately one watt per second to approximately 500 watts per second.

In some embodiments, the at least one RF bias power source may operate at a frequency of less than approximately 6 MHz. In some embodiments, a first RF bias power source may operate at a frequency of approximately 400 kHz and a second RF bias power source may operate at a frequency of approximately 2 MHz. In some embodiments, the first RF bias power source and the second RF bias power source are pulsed together. In some embodiments, the first RF bias power source and the second RF bias power are pulsed independently. In some embodiments, the frequency of the first RF bias power source and the frequency of the second bias power source are mixed with the first RF bias power source frequency of approximately 400 kHz having a voltage output approximately 60% to approximately 80% higher than a peak voltage output of the second RF bias power source frequency of approximately 2 MHz. In some embodiments, the at least one RF bias power source may be ramped to a peak power of approximately 6 kW to a peak power of approximately 15 kW at a ramping rate of approximately one watt per second to approximately 500 watts per second.

In block 308, a layer of oxide and/or nitride is etched with the assistance of at least one bias power source. The etching of the oxide is regulated by controlling the number of ions containing fluorine, F, and the etching of the nitride is regulated by controlling the number of ions containing hydrogen, H. The ratio of ions containing F to the ratio of ions containing H also yields the etching selectivity ratio of oxide to nitride. By controlling the etch gas species accordingly, an etch selectivity ratio of approximately 1:1 for oxide and nitride is achieved.

Figure 5:
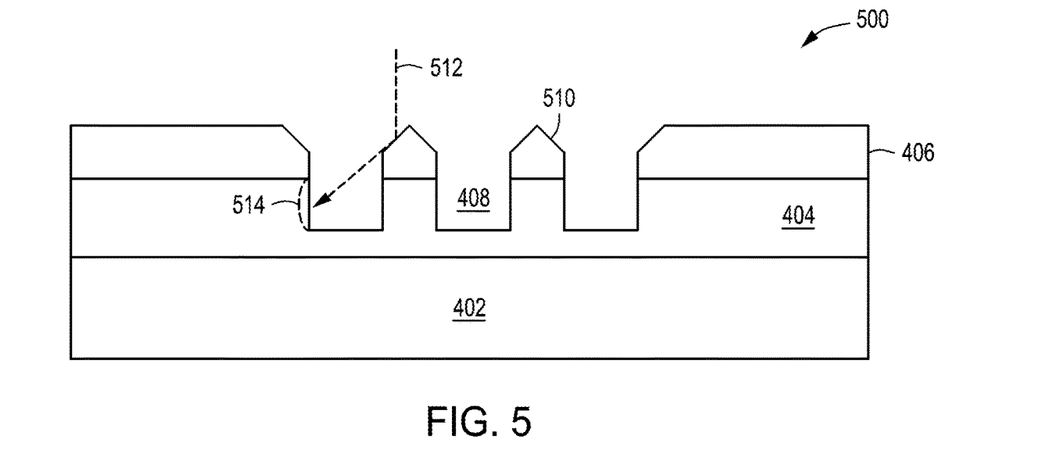
FIG. 5 is a cross-sectional view of the substrate of FIG. 3 after an etching process in accordance with some embodiments of the present principles.

The bias power source or sources accelerate ions toward a bias electrode such as the internal electrode 138 of process chamber 100 (FIG. 1A) and internal electrode 238 of process chamber 200 (FIG. 2A). The bias power sources help to create an anisotropic etch predominantly in the vertical direction perpendicular to the oxide or nitride layer 404. The anisotropic etching etches faster in the vertical direction than in other directions, minimizing sidewall bow of etched features in the oxide or nitride layers. As shown in a cross-sectional view 500 of FIG. 5, the gas mixture also etches the pattern mask 406. The etching process erodes the edges 510 of the openings 408 of the pattern mask 406. If etching continues, ions may be deflected (deflection path shown by arrow 512) into the sidewalls of the features causing sidewall bow 514 and deformation of the feature. In some embodiments, etching may be controlled by using short pulses with a deposition mode in between etching modes to help protect the feature and pattern mask 616 as discussed below.

In block 310, an in-situ protection liner 616 is deposited on the substrate 402. In the deposition mode, the plasma produces a conformal layer of the in-situ protection liner 616 on the substrate 402 as shown in a cross-sectional view 600 of FIG. 6. The in-situ protection liner 616 protects the sidewalls of the features during etching modes and reduces sidewall bow. The in-situ protection liner 616 also protects the edges of the openings 408 of the pattern mask 406 with a passivation layer 'cap' 618 between the openings 408. Because etching affects the pattern mask 406 as well as the oxide or nitride layer 404, the in-situ protection liner 616 also aids in protecting the pattern mask 406 from being prematurely depleted during a subsequent etching mode. In some embodiments noted by dotted line 316, the depositing of the in-situ protection liner may occur prior to etching of the oxide or nitride layer 404 in order to first protect the pattern mask 406.

Figure 6:
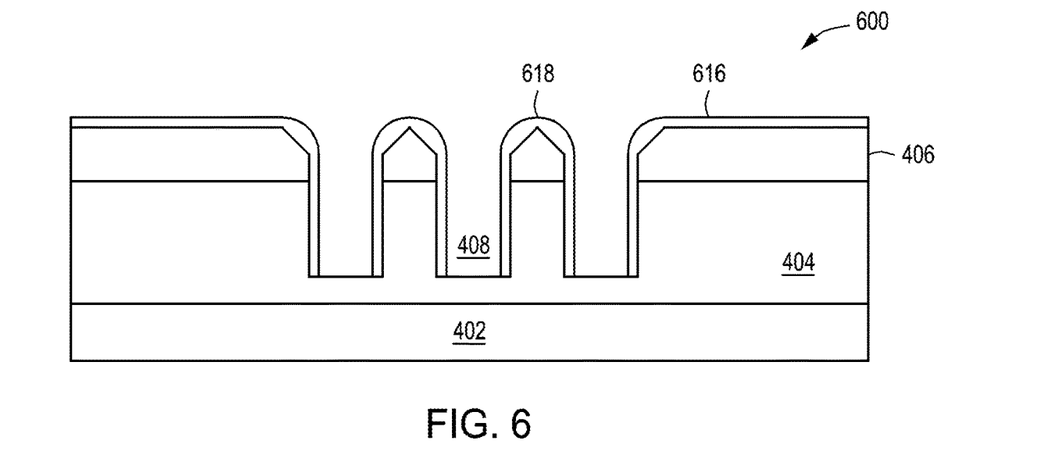
FIG. 6 is a cross-sectional view of the substrate of FIG. 4 after deposition of an in-situ protection liner in accordance with some embodiments of the present principles.

In some embodiments, the in-situ protection liner 616 may be deposited by flowing a fifth gas such as $H_2$, $O_2H_2$, $CF_3I$, COS, $NF_3$, $SF_6$, etc. into the process chamber. The inventors have discovered that a fifth gas composed of acetylene gas ($C_2H_2$) provides a diamond like carbon (DLC) deposition in a low-pressure environment with a high bias power. In some embodiments, the deposition may occur with a pressure of less than approximately 1.5 mTorr (0.2 pascal) and a bias power of approximately 5000 watts or more. The $O_2H_2$ DLC deposition dramatically improves protection against bowing and necking. The $O_2H_2$ DLC deposition also has better conformality, more robust adhesion, and increased hardness over $CH_4$ based DLC. The inventors have found that $CH_4$ DLC will stick on the entrance area of the etched feature and completely clog the feature during processing. Because $O_2H_2$ DLC does not clog, a $O_2H_2$ DLC based in-situ protection liner can reach deeper into an etched feature and is more conformal. The $O_2H_2$ DLC based in-situ protection liner can be used in low pressure processes such as dielectric etch processes to form a more dense DLC layer when combined with a high bias. The $O_2H_2$ DLC based in-situ protection liner provides mask selectivity aiding and control of bow CD for high aspect ratio etching. The DLC deposition process can be achieved with or without using pulsed RF sources and may be integrated into chemical vapor deposition (CVD) processing flows.

During deposition of the DLC in-situ protection liner, in some embodiments, the process chamber inner process volume may have a temperature of 30 degrees Celsius to approximately 60 degrees Celsius. In some embodiments, the electrostatic chuck (ESC) temperature may range from approximately 0 degrees Celsius to approximately 100 degrees Celsius. A flow rate of the acetylene gas may range from approximately 10 sccm to approximately 200 sccm. Optional inert gases such as argon or krypton may also be flowed into the process chamber with the acetylene gas as a carrier. In some embodiments, the DLC in-situ protection liner deposition process is performed from approximately 4 seconds to approximately 30 seconds. In some embodiments, a DLC layer thickness may range from approximately 1 nm to approximately 900 nm.

In block 312, the plasma is interrupted by turning the plasma power source to OFF and gases and/or by-products in the process chamber 100, 200 are pumped out by the vacuum pump 114, 214 while the gas mixture continues to flow into the process chamber 100, 200. In block 314, the process is repeated until an etching result is achieved. The etching result may be a given etching depth, a given etching time, and/or a touchdown to the substrate 402 under the oxide or nitride layer 404. In some embodiments, the fifth gas may be used in a first process to protect the mask with an in-situ protection layer. In some embodiments, the fifth gas may be used to protect the mask and sidewall of a high aspect ratio feature. In some embodiments, the fifth gas may be used during each process repetition to continually protect the mask and sidewalls.

Figure 7:
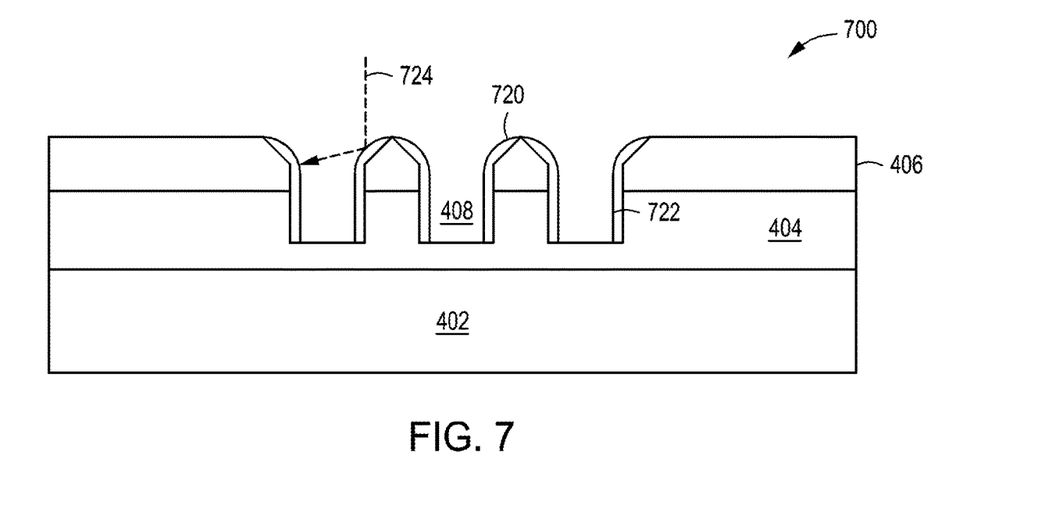
FIG. 7 is a cross-sectional view of the substrate of FIG. 5 after another etching process in accordance with some embodiments of the present principles.

One of the advantages of the method 300 with the in-situ protection liner is that the passivation layer cap 618 protects the edges of the openings 408 during subsequent etching modes as shown in a cross-section view 700 in FIG. 7. The anisotropic etching has etched the top of the pattern mask 406 in predominantly a vertical direction perpendicular to the surface of the pattern mask 406 and in the bottom of the openings 408. The in-situ protection liner 616 has been thinned out due to the etching but an etched cap 720 still provides ion deflection protection during the etching mode (as shown by ion deflection path 724). The ion deflection path 724 has a more acute angle and is deflected into the sidewall of the pattern mask 406 rather than the sidewall 722 of the opening 408, preventing sidewall bow by deflected ions.

Figure 8:
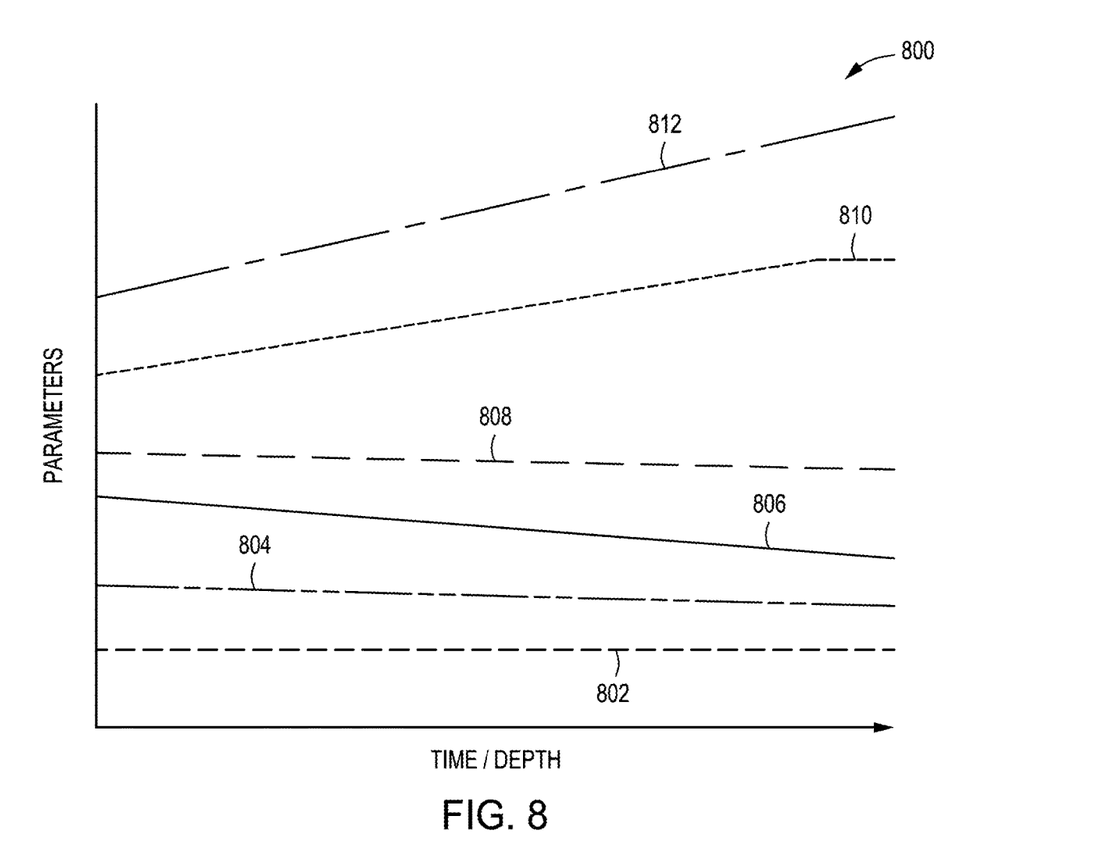
FIG. 8 is a graph of dynamically ramped parameters in accordance with some embodiments of the present principles.

In a graph 800 of FIG. 8, the dynamic ramping of various process parameters used in the method 300 is illustrated. In some embodiments, a third gas 802 is flowed at a constant rate (zero ramping) into the process chamber 100. In some embodiments, the pressure is increased, held constant, or, as in FIG. 8, the pressure 804 of the process chamber 100, 200 is slowly decreased over time or etching depth. In some embodiments, the pressure ramping rate is very small such as approximately 1 mTorr per 1000 seconds and the like. The gas mixture flow rate 806 is decreased over time or etching depth. The plasma source power 808 is slowly decreased over time or etching depth. The bias source voltage 810 is increased over time or etch depth and may remain constant at some point in time or etch depth. A fourth gas 812 such as $O_2$ or $N_2$ may also be ramped upward over time or etch depth to help clean areas affected by necking. The $O_2$ or $N_2$ affects the pattern mask as a whole so the flow rate of the $O_2$ or $N_2$ may be initially reduced to help preserve the pattern mask and then increased over time or etch depth to permit greater penetration into the feature. In some embodiments, the $O_2$ or $N_2$ flow rate ramping may be approximately 0.01 sccm per second to approximately 0.1 sccm per second. In some embodiments, plasma source power or bias source power may have a ramping rate of approximately one watt per second to approximately two watts per second.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for etching a substrate, comprising:
   forming a first diamond like carbon (DLC) deposition on a pattern mask using acetylene gas ($C_2H_2$);
   flowing a gas mixture of a first gas of a hydrofluorocarbon-based gas and a second gas of a fluorocarbon-based gas into a process chamber;
   diluting the gas mixture by flowing an inert gas into the process chamber;
   flowing a third gas into the process chamber, the third gas is an organic film ashable chemistry-based gas;
   forming a plasma from the gas mixture using an RF power source and providing biasing with at least one RF bias power source;
   performing an anisotropic etch, via the plasma, of at least one layer of oxide or nitride on the substrate using the pattern mask;
   forming a second diamond like carbon (DLC) deposition on the pattern mask or the at least one layer of oxide or nitride on the substrate;
   evacuating the process chamber while interrupting the RF power source to stop plasma formation; and
   repeating the etching and DLC deposition to form at least one hole through a plurality of alternating oxide and nitride layers on the substrate to expose portions of the substrate.

2. The method of claim 1, further comprising:
   flowing gas mixture into the process chamber at a flow rate of approximately 100 sccm to approximately 200 sccm; or
   flowing the third gas into the process chamber at a flow rate of approximately 100 sccm.

3. The method of claim 1, wherein the RF power source is connected to an upper electrode above the substrate and the at least one RF bias power source is connected to a lower electrode under the substrate.

4. The method of claim 1, wherein the RF power source and the at least one RF bias power source are connected to at least one lower electrode under the substrate.

5. The method of claim 1, further comprising:
performing a dynamic ramping of at least one process parameter based on a processing time or etch depth.

6. The method of claim 1, wherein the first gas has a chemical composition of $C_3H_2F_4$ and the second gas has a chemical composition of $C_3F_6$.

7. The method of claim 1, further comprising:
etching alternating layers of oxide and nitride on the substrate with the gas mixture of the first gas and the second gas having an oxide to nitride selectivity of approximately 1:1.

8. The method of claim 1, further comprising:
pulsing the RF power source to form the plasma; and
pulsing the at least one RF bias power source to assist in ion attraction towards the substrate.

9. The method of claim 8, further comprising:
linking the RF power source to the at least one RF bias power source and respective impedance matching networks to adjust RF power delivery to the process chamber.

10. The method of claim 8, further comprising:
forming the plasma with the RF power source operating at a frequency of approximately 40 MHz to approximately 200 MHz; and
performing the anisotropic etch with the at least one RF bias power source operating at a frequency less than approximately 6 MHz.

11. The method of claim 8, wherein the RF power source has a peak power level less than the at least one RF bias power source.

12. A method for etching a substrate, comprising:
forming a first diamond like carbon (DLC) deposition on a pattern mask using acetylene gas ($C_2H_2$);
flowing a gas mixture of a first gas of a hydrofluorocarbon-based gas and a second gas of a fluorocarbon-based gas into a process chamber, the gas mixture having an oxide to nitride etching selectivity of approximately 1:1;
diluting the gas mixture by flowing an inert gas into the process chamber;
flowing a third gas into the process chamber, the third gas is configured to prevent clogging during etching;
forming a plasma from the gas mixture using an RF power source and providing with at least one RF bias power source;
performing an anisotropic etch, via the plasma, of at least one layer of oxide or nitride on the substrate using the pattern mask;
flowing acetylene gas ($C_2H_2$) into the process chamber to produce a second diamond like carbon (DLC) deposition on the pattern mask or on the at least one layer of oxide or nitride on the substrate;
evacuating the process chamber while interrupting the RF power source to stop plasma formation; and
repeating the etching and DLC deposition to form at least one hole through a plurality of alternating oxide and nitride layers on the substrate.

13. The method of claim 12, wherein the DLC deposition occurs at an RF bias power of approximately 500 volts or higher.

14. The method of claim 12, wherein the DLC deposition occurs at a pressure of approximately 0.2 pascal.

15. The method of claim 12, further comprising:
ramping a flow rate of the inert gas upward based on processing time or etch depth.

16. The method of claim 12, further comprising:
repeating the method to form at least one hole through a plurality of alternating oxide and nitride layers on the substrate to expose portions of the substrate.

17. The method of claim 12, wherein the first gas has a chemical composition of $C_3H_2F_4$, the second gas has a chemical composition of $C_3F_6$, the inert gas is krypton, and the third gas is oxygen.

18. The method of claim 12, further comprising:
ramping a flow rate of the gas mixture downward based on processing time or etch depth.

19. The method of claim 12, further comprising:
dynamically ramping one or more process parameters to provide active aspect ratio dependent etching control for selective reactive ion etching by depth.

20. A non-transitory computer readable medium having instructions stored thereon that, when executed, cause a method of operating a substrate processing system to be performed, the method comprising:
forming a first diamond like carbon (DLC) deposition on a pattern mask using acetylene gas ($C_2H_2$);
flowing a gas mixture of a first gas of a hydrofluorocarbon-based gas and a second gas of a fluorocarbon-based gas into a process chamber, the gas mixture having an oxide to nitride etching selectivity of approximately 1:1;
diluting the gas mixture by flowing an inert gas into the process chamber;
flowing a third gas into the process chamber, the third gas is configured to prevent clogging during etching;
forming a plasma from the gas mixture using an RF power source and providing biasing with at least one RF bias power source;
performing an anisotropic etch, via the plasma, of at least one layer of oxide or nitride on a substrate using the pattern mask;
flowing acetylene gas ($C_2H_2$) into the process chamber to produce a second diamond like carbon (DLC) deposition on the pattern mask or on the at least one layer of oxide or nitride on the substrate;
evacuating the process chamber while interrupting the RF power source to stop plasma formation; and
repeating the etching and DLC deposition to form at least one hole through a plurality of alternating oxide and nitride layers on the substrate.

* * * * *

UNITED STATES PATENT AND TRADEMARK OFFICE
CERTIFICATE OF CORRECTION

PATENT NO. : 11,373,877 B2
APPLICATION NO. : 16/846869
DATED : June 28, 2022
INVENTOR(S) : Daisuke Shimizu et al.

It is certified that error appears in the above-identified patent and that said Letters Patent is hereby corrected as shown below:

On the Title Page

In Column 1, Line 7, item (72) delete "Mie (JP)" and insert -- Yokkaichi, Mie (JP) --

In the Specification

In Column 14, Line 48, delete "Hz, O2H2," and insert -- H2, C2H2, --

In Column 14, Line 55, delete "5000 watts" and insert -- 500 watts --

In Column 14, Line 56, delete "O2H2" and insert -- C2H2 --

In Column 14, Line 57, delete "O2H2" and insert -- C2H2 --

In Column 14, Line 62, delete "O2H2" and insert -- C2H2 --

In Column 14, Line 62, delete "O2H2" and insert -- C2H2 --

In Column 14, Line 64, delete "O2H2" and insert -- C2H2 --

In Column 14, Line 67, delete "O2H2" and insert -- C2H2 --

Signed and Sealed this
Twenty-third Day of August, 2022

Katherine Kelly Vidal
*Director of the United States Patent and Trademark Office*